(12) United States Patent
Glocker et al.

(10) Patent No.: US 6,733,642 B2
(45) Date of Patent: May 11, 2004

(54) SYSTEM FOR UNBALANCED MAGNETRON SPUTTERING WITH AC POWER

(76) Inventors: David A. Glocker, 791 Rush Henrietta Town Line Rd., Rush, NY (US) 14543; Mark Romach, 78 Ridge Meadows Dr., Spencerport, NY (US) 14559

( * ) Notice: Subject to any disclaimer, the term of this patent is extended or adjusted under 35 U.S.C. 154(b) by 0 days.

(21) Appl. No.: 10/134,279

(22) Filed: Apr. 29, 2002

(65) Prior Publication Data

US 2002/0195336 A1 Dec. 26, 2002

Related U.S. Application Data

(60) Provisional application No. 60/287,609, filed on Apr. 30, 2001.

(51) Int. Cl.$^7$ ................................................ C23C 14/35
(52) U.S. Cl. ......................... 204/298.18; 204/298.08; 204/298.19; 204/298.26
(58) Field of Search ............... 204/298.08, 298.12, 204/298.17, 298.18, 298.19, 298.21, 298.26

(56) References Cited

U.S. PATENT DOCUMENTS

| | | | |
|---|---|---|---|
| 4,041,353 A | 8/1977 | Penford et al. | 315/267 |
| 4,111,782 A | 9/1978 | Penfold et al. | 204/298.21 |
| 4,116,794 A | 9/1978 | Penfold et al. | 204/192.12 |
| 4,132,612 A | 1/1979 | Penfold et al. | 204/192.12 |
| 4,132,613 A | 1/1979 | Penfold et al. | 204/192.12 |
| 4,828,668 A * | 5/1989 | Yamazaki et al. | 204/192.12 |
| 5,082,546 A | 1/1992 | Szcayrbowski et al. | 204/298.08 |
| 5,169,509 A | 12/1992 | Latz et al. | 204/298.03 |
| 5,196,105 A | 3/1993 | Feuerstein et al. | 204/192.12 |
| 5,415,757 A * | 5/1995 | Szcyrbowski et al. | 204/192.12 |
| 5,556,519 A | 9/1996 | Teer | 204/192.12 |
| 6,113,752 A * | 9/2000 | Hollstein | 204/192.12 |

OTHER PUBLICATIONS

B. Window and N. Savvides; Charged Particle Fluxes From Planar Magnetron Sputtering Sources; J. Vac. Sci. Technol. A 4 (2), Mar/Apr. 1986; pp. 196–202.
B. Window and N. Savvides; Unbalanced DC Magnetrons as Sources of High Ion Fluxes; J. Vac. Scl. Technol. A 4(3), May/Jun. 1986; pp. 453–456.
S.L.Rohde, L.Petrov, W.D. Sproul, S.A. Barnett, P.J. Rudnik & M.E. Graham; Effects of an Unbalanced Magnetron in a Unique Dual–Cathode, High Rate Reactive Sputtering System; Thin Solid Films, 193/194 (1990); pp. 117–126.

* cited by examiner

Primary Examiner—Rodney G. McDonald
(74) Attorney, Agent, or Firm—Neal L. Slifkin; Harris Beach LLP

(57) ABSTRACT

An array of unbalanced magnetrons arranged around a centrally-located space for sputter coating of material from target electrodes in the magnetrons onto a substrate disposed in the space. The electrodes are powered in pairs by an alternating voltage and current source. The unbalances magnetrons, which may be planar, cylindrical, or conical, are arranged in mirror configuration such that like poles are opposed across the substrate space or are adjacent on the same side of the substrate space. The magnetrons are all identical in magnetic polarity. A positive plasma potential produced by the AC driver prevents electrons from escaping to ground along the unclosed field lines, increasing plasma density in the background working gas and thereby improving the quality of coating being deposited on the substrate.

2 Claims, 7 Drawing Sheets

SYSTEM FOR UNBALANCED MAGNETRON SPUTTERING WITH AC POWER

RELATIONSHIP TO OTHER APPLICATIONS AND PATENTS

This application draws priority from U.S. Provisional Application No. 60/287,609, filed Apr. 30, 2001 by Glocker et al.

FIELD OF THE INVENTION

The Present invention relates to apparatus for magnetron sputtering of a target material onto a substrate; more particularly to such apparatus including an array of unbalanced magnetrons wherein some of the magnetic field lines arising in each magnetron are not closed in the magnetron but either are open or are closed in a different magnetron, and most particularly, to such apparatus wherein magnetron cathodes are arranged in a "mirror" configuration and are driven in pairs by AC power supplies. Apparatus and methods in accordance with the invention are especially useful for magnetron sputter deposition of electrically insulative materials at high rates with significant ion bombardment of the substrate.

BACKGROUND OF THE INVENTION

Magnetron sputtering is a widely used method for coating relatively thin films of a target material on a substrate surface. Many applications for which magnetron sputtering is particularly well-suited, such as coatings for wear and corrosion resistance and dense dielectric coatings, benefit from a high level of ionization in the vicinity of the substrate being coated. This permits effective use of substrate electrical bias, or creates a level of self-bias on non-conducting substrates, that can improve the properties of the films being deposited through controlled levels of ion bombardment of the coating.

A useful method of increasing plasma density near the substrate(s) is "unbalanced" magnetron sputtering, wherein part of the magnetic field, which in balanced magnetrons confines electrons to the vicinity of the target, is allowed to extend away from the target surface toward the substrate(s) on which the material is being deposited. Thus, some of the field lines emanating from the target surface do not close back through the target surface, allowing electrons, which are highly mobile in directions parallel to the magnetic field lines, to be accelerated away from the target, whereby the electrons can desirably ionize the working gas in the vicinity of the substrate. Window and Savvides first described unbalanced magnetrons; see *Journal of Vacuum Science and Technology* A4, 196 (1986) and *Journal of Vacuum Science and Technology* A4, 453 (1986).

In prior art unbalanced magnetrons, the "open" or unbalanced magnetic field lines can project from either the outside of the target surface or the inside of the target surface; and the targets can be circular, rectangular, or any other desired planar shape. The magnetic polarity is also unimportant, and either the north or the south magnetic pole can be used to create the open or unbalanced field lines in all cases. In some instances, a plurality of unbalanced magnetron cathodes are used in concert to form a plasma trap surrounding a substrate. Such devices are disclosed, for example, in U.S. Pat. Nos. 5,196,105 and 5,556,519. Such a multiple-cathode arrangement is particularly beneficial in large coaters used to deposit hard and/or corrosion-resistant materials, especially on irregular three-dimensional objects. Frequently, the higher plasma densities produced by unbalanced magnetron sputtering are augmented by a negative electrical bias applied to the substrate, which accelerates ions toward the growing film with resulting improvements in density, composition, and microstructure of the deposited material. Therefore, it is highly desirable to provide a relatively high ionization density in the region near the substrate.

It is impotent to note that in all prior art arrays of multiple unbalanced planar magnetron cathodes, there exists a direct magnetic "linkage" between the cathodes in the array, and further, that the cathodes are powered with a DC voltage and current, as shown, for example, in FIGS. 1–5 in U.S. Pat. No. 5,196,105. Without such magnetic linkage between cathodes, the plasma density in the region near the substrate is substantially reduced. In contrast, in a "mirror" configuration in which there is no magnetic linkage between opposing cathodes, the ion saturation current is a fraction of what it is in the "opposed" case with magnetic linkage. See "Effects of an Unbalanced Magetron in a Unique Dual Cathode, High Rate Readtive Sputtering System," by Rhode et al., and published in *Thin Solid Films*, 193/194 (1990) pp. 117–126. A possible explanation of this phenomenon is that the plasma potential in these DC-driven arrays is negative, which means that in the mirror configuration, electrons migrating along open field lines are lost to the walls of the sputtering chamber before they can produce significant levels of ionization.

Therefore, all prior art arrays of unbalanced planar magnetron cathodes have "opposed" polar configurations such that the cathodes are magnetically linked. Arrays are known to comprise as many as four or more magnetrons, but in all such prior art magnetron arrays, the cathodes are DC driven and the cathodes are linked by magnetic field lines.

Another sputter coating method in wide use, especially for deposition of insulative materials at high deposition rates, is reactive sputtering using two magnetron cathodes coupled by an alternating current (AC) power supply. See "dual cathode sputtering" as disclosed, for example, in U.S. Pat. Nos. 4,041,353; 4,111,782; 4,116,793; 4,116,794; 4,132,612; 4,132,613; 5,082,546; and 5,169,509. A serious problem arises, however, in attempting to combine such AC-driven sputtering with prior art configurations of unbalanced magnetrons to achieve superior coatings. Because of alternating current in the driver, each electrode in each magnetron alternates between being an anode and a cathode with each cycle. While one electrode is attracting ions and being sputtered, the other is attracting electrons. Thus, each "unbalanced" magnetic field line extending between cathodes becomes effectively an electrical "short" and so prior art arrays of "opposed" unbalanced magnetrons cannot use AC sputtering at high plasma densities to enable high rate reactive sputtering of insulative materials. Such conditions would be highly useful in sputter coating to produce, for example, aluminum oxide with excellent properties.

What is needed is a means for utilizing an array of unbalanced magnetrons driven by AC voltage and current to yield a high deposition rate of insulating materials.

SUMMARY OF THE INVENTION

Briefly described, an array of unbalance magnetrons is arranged around a centrally-located substrate for sputter coating of material from cathodes in the magnetrons onto the substrate. The electrodes are powered in pairs by an alternating voltage and current source. The unbalanced magnetrons, which may be planar, cylindrical, or conical, are arranged in mirror configuration such that like poles are opposed across the substrate space or are adjacent on the same side of the substrate space. The magnetrons are all identical in magnetic polarity. Because of the mirror configuration, the magnetrons are not capable of magnetic linking with one another, despite being unbalanced. Because the peripheral poles have the greater magnetic cross-sectional area, unclosed lines of flux extend away from the array. Because of the positive plasma potential produced by an AC driver, electrons are prevented from escaping to ground along the unclosed field lines. The positive plasma potential attracts electrons to the vicinity of the substrate, increasing plasma density in the background working gas and thereby improving the quality of coating being deposited on the substrate.

BRIEF DESCRIPTION OF THE DRAWINGS

The foregoing and other objects, features, and advantages of the invention, as well as presently preferred embodiments thereof, will become more apparent from a reading of the following description in connection with the accompanying drawings in which.

DETAILED DESCRIPTION OF THE PREFERRED EMBODIMENTS

The benefits of the present invention may be more fully appreciated by first considering a prior art unbalanced planar magnetron array.

Figure 1:
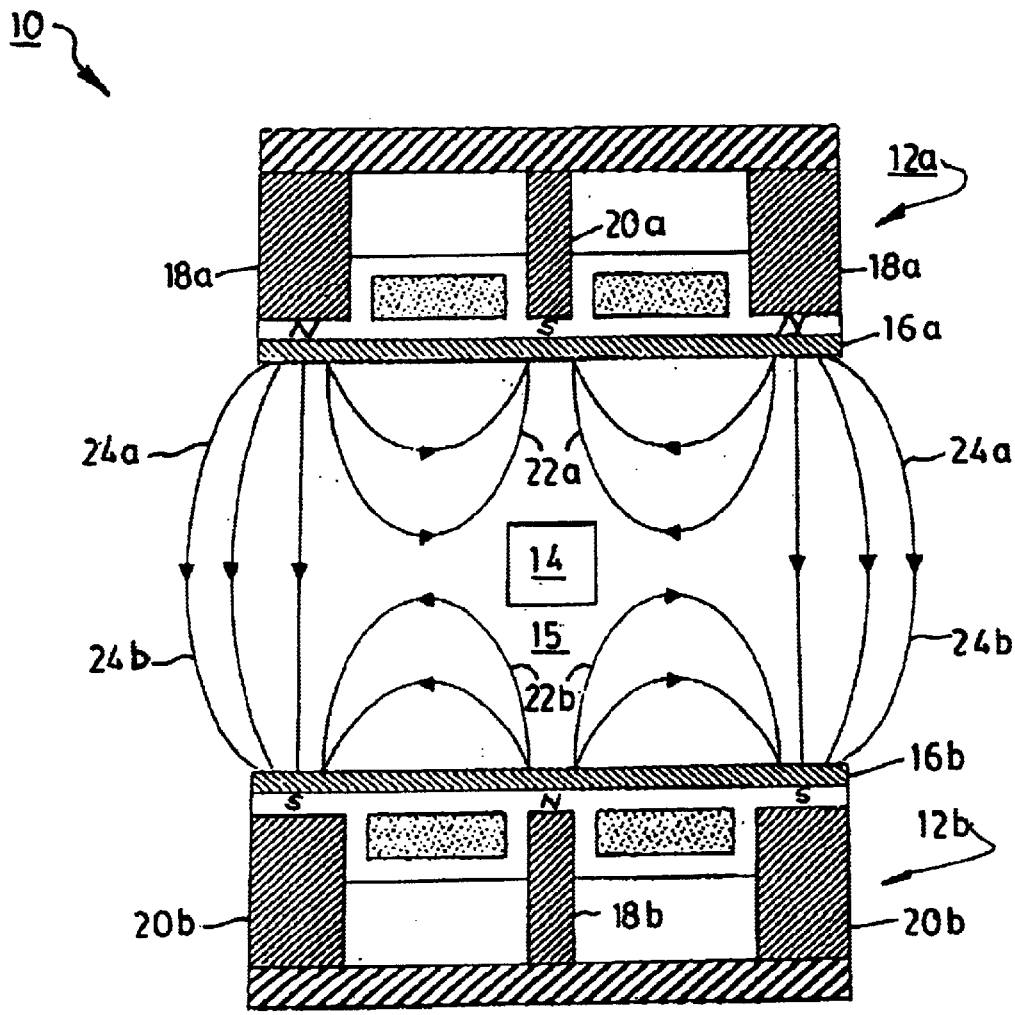
FIG. 1. is a cross-sectional view of a prior art DC powered unbalanced planar magnetron array, showing linked configuration between two opposite-polarity magnetrons disposed across a substrate space.

Referring to FIG. 1, a first prior art array 10 includes first and second unbalanced planar magnetrons 12a,b having opposite polarities and being disposed on opposite sides of a substrate 14 disposed in plasma space 15 to be coated by material sputtered from cathode targets 16a,b. Cathodes 16a,b are powered conventionally by one or more DC power sources (not shown). Magnetron 12a has peripheral north pole pieces 18a having greater magnetic cross-sectional area than central south pole piece 20a, resulting in magnetic field lines 22a which close within cathode 16a and field lines 24a which do not. Magnetron 12b has peripheral south pole pieces 20b having grater magnetic cross-sectional area than central north pole piece 18b, resulting in magnetic field lines 22b which close within cathode 16b and field lines 24b which do not. Field lines 24a,b, arising in magnetron 12a and closing in magnetron 12b, define a magnetic cage for retaining electrons within substrate space 15. Because south pole piece 20a is opposite north pole piece 18b, and north pole pieces 18a are opposite south pole pieces 20b, magnetrons 12a,b are said to be in "opposed" configuration and are magnetically "linked" by field lines 24a,b.

Desirably, the retained electrons increase ionization of the background gas, typically argon, in the vicinity of substrate 145. Substrate 14 may become negatively biased with respect to ground, or may be actively biased in known fashion, such that relatively low-energy positively charged argon ions are drawn to impact the substrate where they assist in compacting the material being deposited in a process known in the art as "atomic peening."

Figure 2:
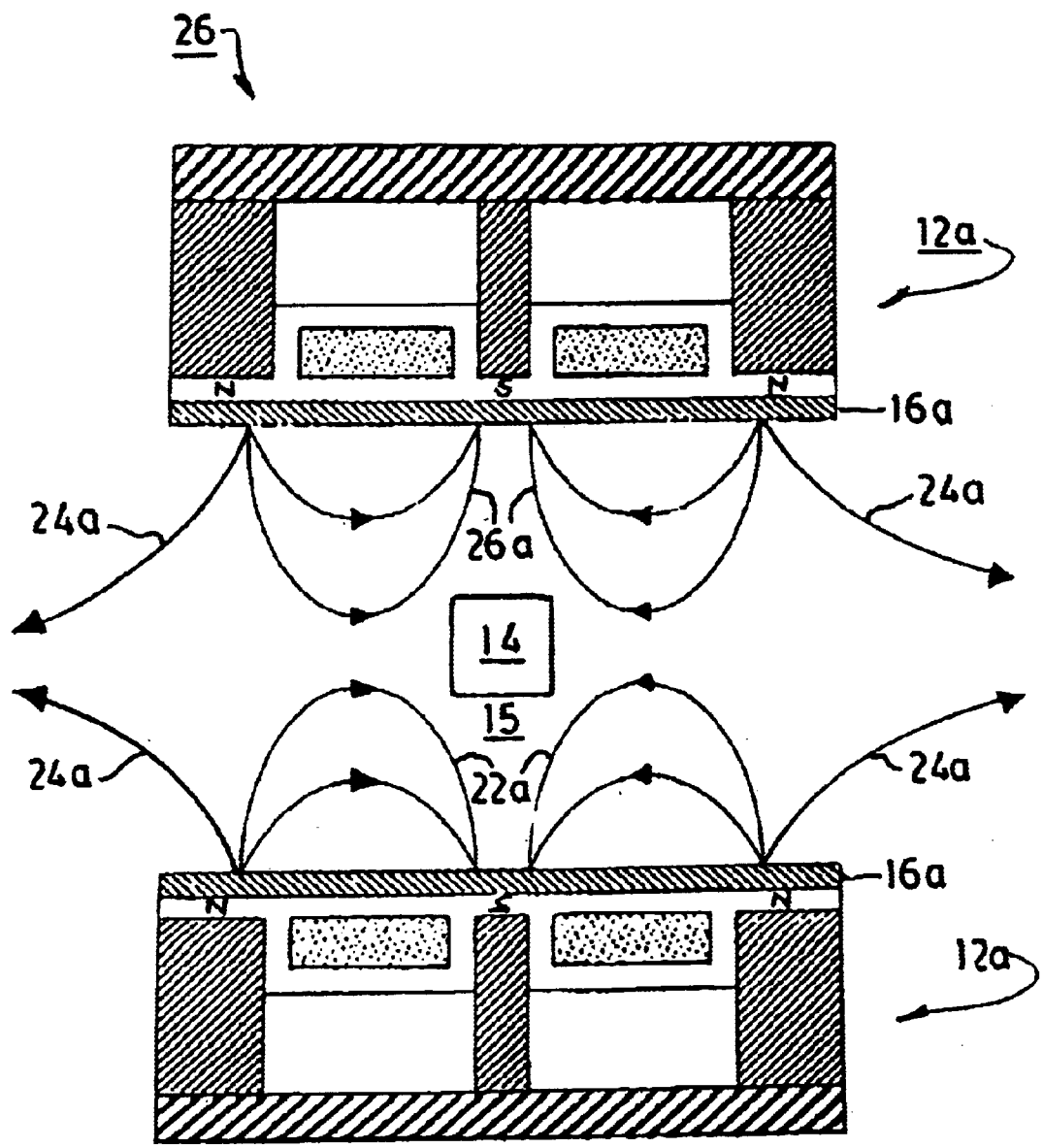
FIG. 2. is a cross-sectional view of a prior art DC powered unbalanced planar magnetron array, showing mirror configuration between two like-polarity magnetrons disposed across a substrate space.

Referring to FIG. 2, a second prior art unbalanced magnetron array 26 driven conventionally by DC power comprises first and second identical magnetrons, each being substantially identical to magnetron 12a, disposed on opposite sides of a substrate 14 disposed in plasma space 15 to be coated by material sputtered from cathode targets 16a. Since north poles are opposite north poles, and south poles are opposite south poles, the open field lines 24a cannot link, so there is no magnetic linkage between the magnetrons. The magnetrons are said to be in "mirror" configuration. Further, the plasma bias is negative, allowing electrons to follow open lines 24a and escape from the system. Thus, plasma formation around substrate 14 is weak, and film formation on the substrate surface is not enhanced. Array 26 is undesirable for forming well-compacted films.

Figure 3:
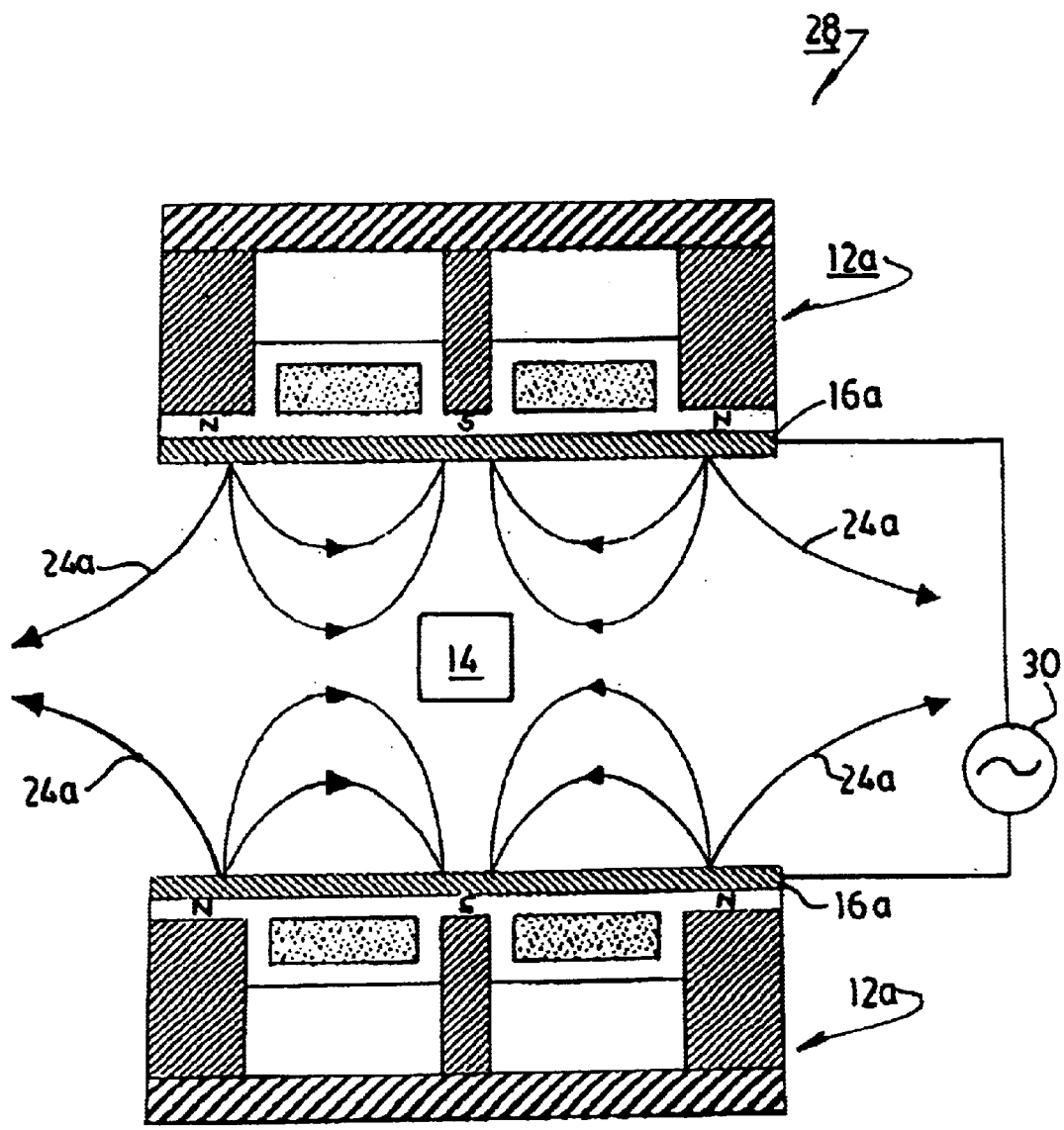
FIG. 3. is a cross-sectional view of the like-polarity unbalanced planar magnetron array shown in FIG. 2, modified for AC power to the electrodes in accordance with the invention.
Figure 4:
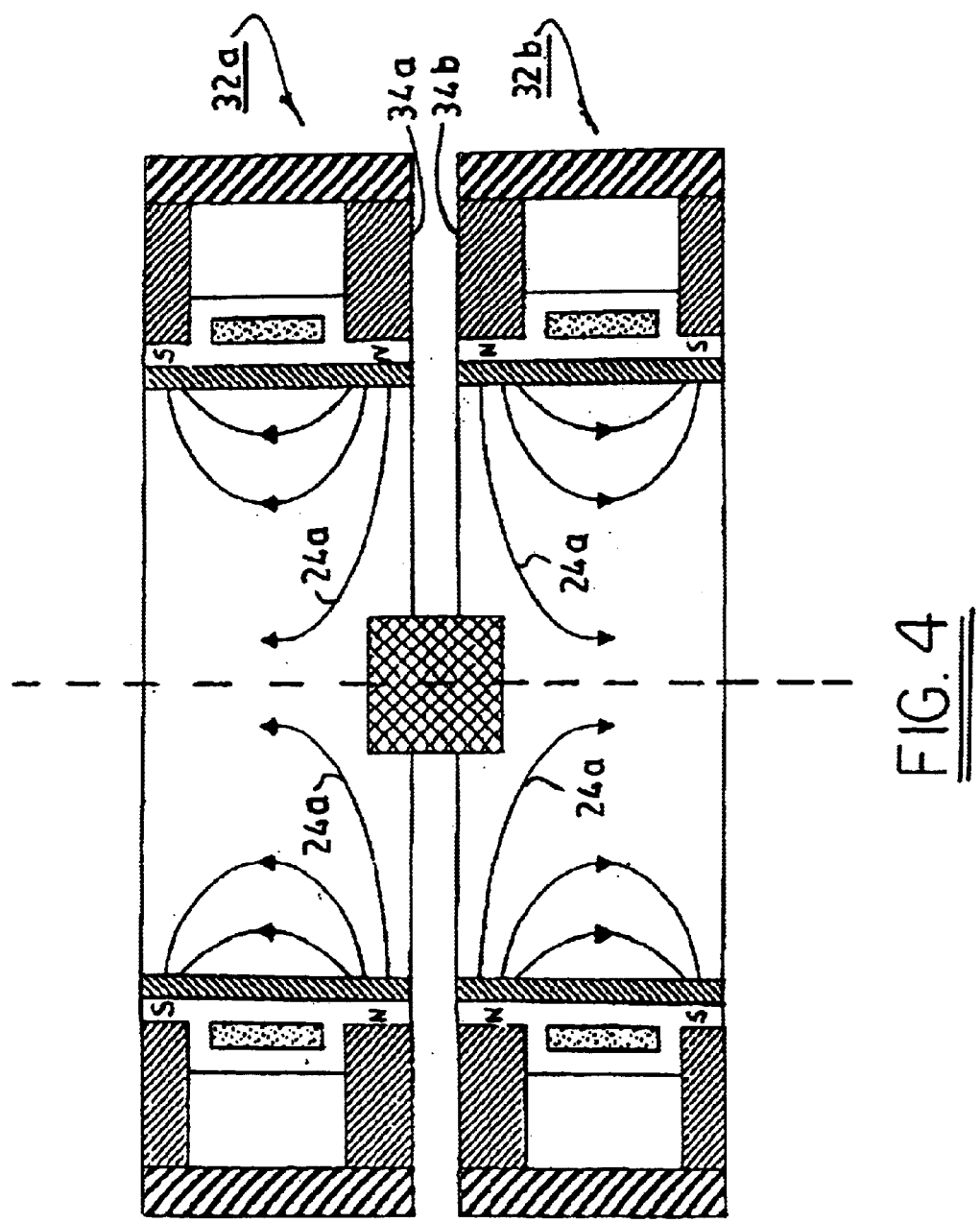
FIG. 4. is a cross-sectional view of an unbalanced cylindrical magnetron array, showing inherent mirror configuration of a single magnetron across the cylindrical substrate space, and mirror configuration between two adjacent identically-polarized unbalanced magnetrons.

Referring to FIG. 3, a first unbalanced magnetron array 28 in accordance with the invention is substantially identical with second prior art array 26 except that the an AC power source 30 is connected across cathodes 16a in place of DC power, such that the direction of current flow to the cathodes is alternated according to the periodicity of the AC driver. Typically, such frequency is comparable to radio frequencies. As already described above, such an arrangement is well known in the art wherein the two magnetrons are balanced, no significant linkage exists, nor are there any open lines of magnetic flux. Further, such an arrangement would be undesirable for an array of linked unbalanced magnetrons, as discussed hereinabove Referring to FIG. 4, which is the subject matter of our co-pending application, Ser. No. 09/805,331, pair of cylindrical magnetrons 32a,b are arranged in mirror relationship, the adjacent unbalanced poles 34a,b being of the same polarity (north poles, as shown, although adjacent unbalanced south poles is equivalent). Thus, there is no magnetic linkage between the magnetrons.

Figure 5:
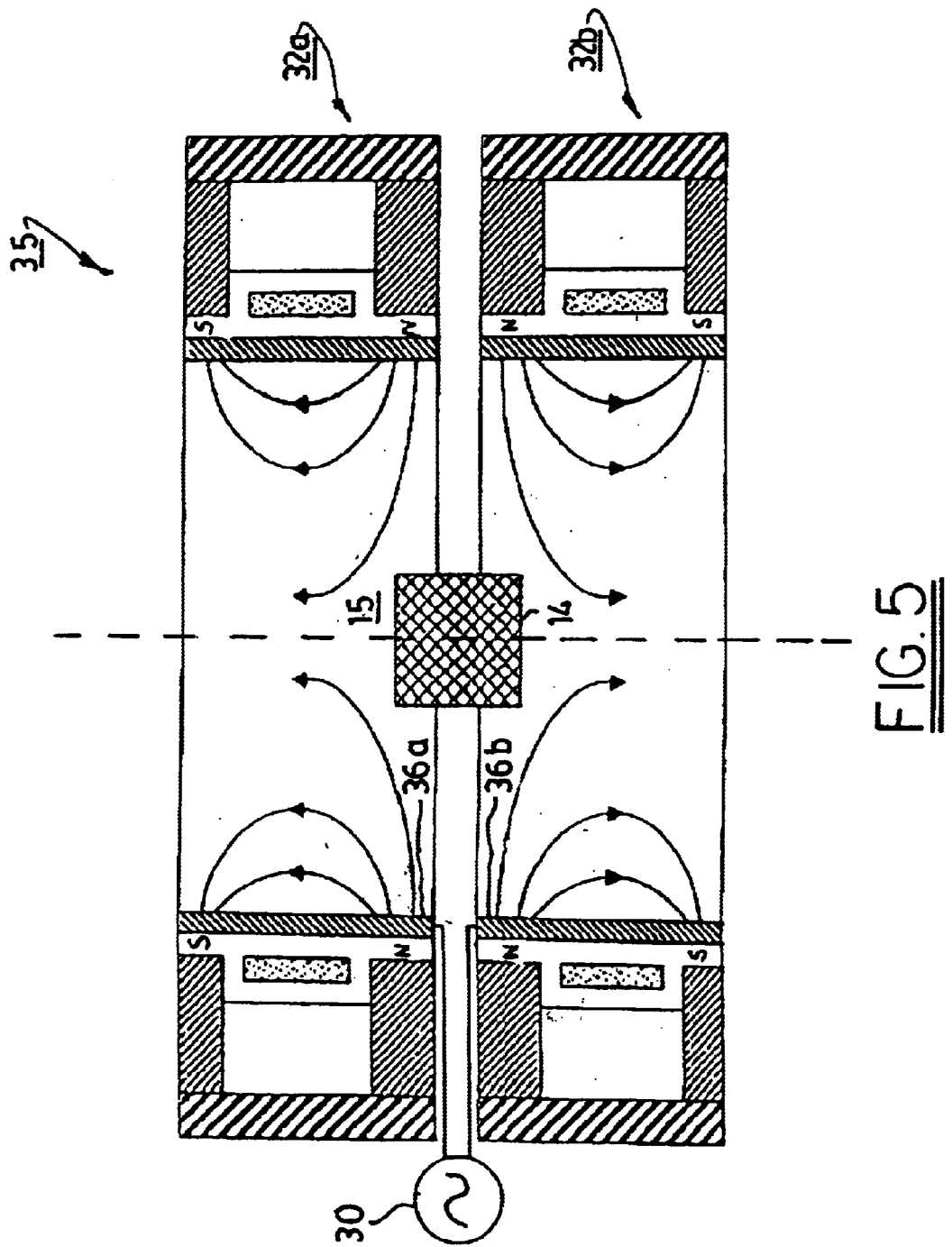
FIG. 5. is a cross-sectional view of the magnetron array shown in FIG. 4, modified for AC power to the cathodes in accordance with the invention.

Referring to FIG. 5, in a second embodiment 35 in accordance with the invention, an AC power source 30 is connected across the cylindrical cathodes 36a,b, replacing conventional DC power sources. Very high ion current densities can be produced by embodiment 35.

What we have found, most surprisingly and unexpectedly, is that when a DC power source is replaced by an AC driver connected across a pair of mirror-arranged unbalanced and preferably identical magnetrons, as shown in FIG. 5, extremely high ion saturation currents are created in plasma space 15 even though there is no linkage. The following levels of ion current density, expressed as milliamperes/centimeter squared, have been determined under the following test configurations:

TABLE 1

| | |
|---|---|
| Prior art, mirrored, 3 kW DC per cathode (FIG. 2) | 2 |
| Prior art, opposed, 3 kW DC per cathode (FIG. 1) | 10 |
| Present invention, mirrored, 1.5 K2 AC per cathode (FIG. 5) | 18 |

Without being bound to an explanation, these results can be interpreted as follows. As discussed previously, prior art unbalanced magnetrons operating with DC power result in a negative plasma potential with respect to ground. Contrarily, two ungrounded magnetrons operated in a mirrored configuration, whether they are planar or cylindrical, produce a positive plasma potential with respect to ground. Therefore, the electrons needed to produce high ion densities cannot escape to grounded surfaces readily along the unbalanced field lines 24a. This surprising result enables simultaneous use of unbalanced magnetron sputtering and reactive sputtering of, for example, insulative materials such as aluminum oxide.

Other mirror configurations are possible within the scope of the invention.

Figure 6:
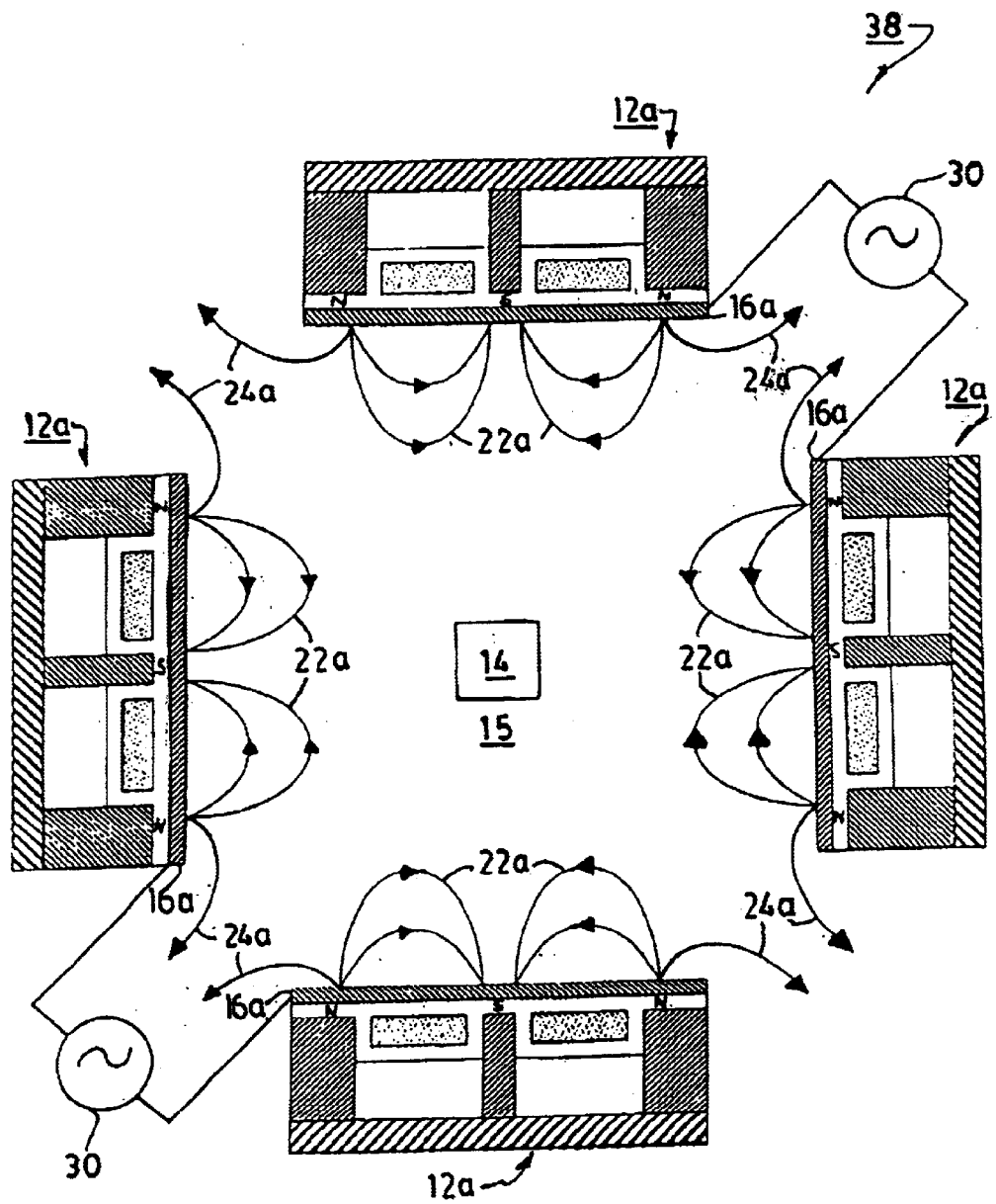
FIGS. 6 and 7 show alternative embodiments of is a cross-sectional view of an unbalance planar magnetron array in accordance with the invention, showing two pairs of identical-polarity magnetrons modified for AC power to the cathodes.
Figure 7:
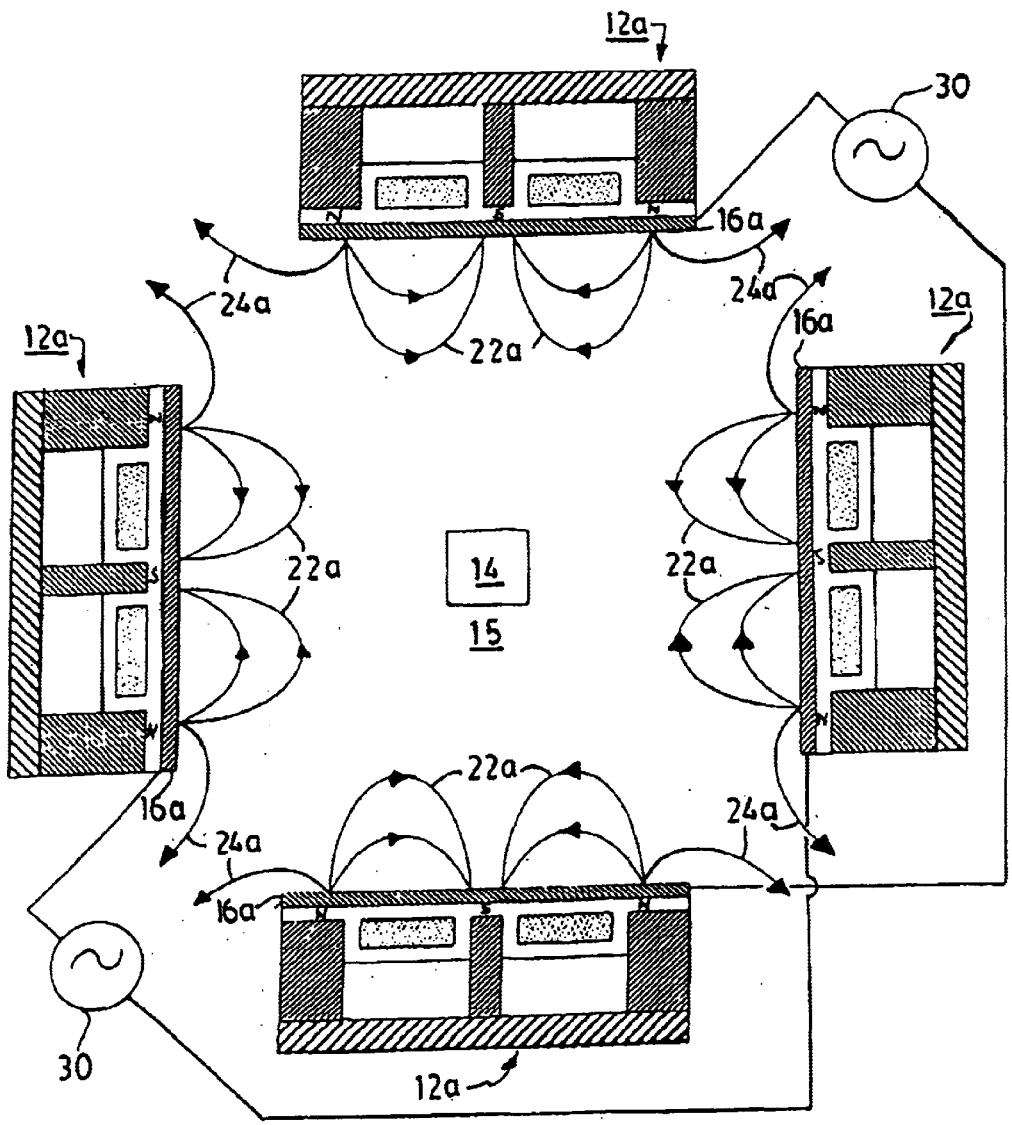

Referring to FIG. 6, a third embodiment 38 in accordance with the invention comprises four unbalanced magnetrons 12a arranged in a square about a substrate 14 in a plasma space 15 The configuration is substantially the result of combining two unbalanced magnetron arrays 28 in an arrangement where adjacent magnetrons are disposed at 90° to each other and is unbalanced north poles being adjacent, and the adjacent cathodes are electrically driven by a common AC source. FIG. 7 alternatively shows opposite cathodes driven by a common AC source to equal effect, within the scope of the invention.

Unbalanced magnetron arrays driven by AC power sources in accordance with the invention are especially useful in producing high-quality coated films, especially of insulative materials, by AC reactive sputtering of a target material. For example, an aluminum target may be sputtered in the presence of a controlled atmosphere including oxygen to deposit a film of aluminum oxide on a substrate surface. Such films formed in apparatus in accordance with the invention typically are superior in density, hardness, and wear characteristics to comparable films produced in the prior art either by DC unbalanced sputtering or AC balanced reactive sputtering.

While the invention has been described by reference to various specific embodiments, it should be understood that numerous changes may be made within the spirit and scope of the inventive concepts described. Accordingly, it is intended that the invention not be limited to the described embodiments, but will have full scope defined by the language of the following claims

What is claimed is:

1. A system for sputter coating a film of material onto a substrate, comprising:

a) an array including first and second unbalanced magnetrons having the same north and south magnetic polarities and being arranged in mirror configuration defining a space for receiving said substrate therebetween such that like poles are opposed, each of said magnetrons including an electrode target formed of said material;

b) a first alternating current and voltage power source electrically connected to said first and second electrode targets for alternatingly energizing said targets as cathodes and anodes; and c) third and fourth unbalanced magnetrons like said first and second magnetrons, said four magnetrons being arranged in a square surrounding said space for receiving said substrate, and a second alternating current and voltage source being electrically connected to said third and fourth electrode targets for alternatingly energizing said targets as cathodes and anodes, said four unbalanced magnetrons cooperating to form a high ion density plasma surrounding said substrate without magnetic coupling between any of said magnetrons in said array.

2. A system for sputter coating a film of material onto a substrate, comprising:

a) an array including first and second unbalanced magnetrons having the same north and south magnetic polarities and being arranged in mirror configuration, and third and fourth unbalanced magnetrons like said first and second magnetrons and also being arranged in mirror configuration, said four magnetrons being arranged in a square surrounding and defining said space for receiving said substrate therebetween such that like poles are opposed without magnetic coupling between any of said magnetrons in said array, each of said magnetrons including an electrode target formed of said material;

b) a first alternating current and voltage power source electrically connected to said first and third electrode targets for alternatingly energizing said targets as cathodes and anodes; and c) a second alternating current and voltage source being electrically connected to said second and fourth electrode targets for alternatingly energizing said targets as cathodes and anodes, said four unbalanced magnetrons cooperating to form a high ion density plasma surround said substrate.

* * * * *